United States Patent [19]

Ballato

[11] Patent Number: 4,625,138
[45] Date of Patent: Nov. 25, 1986

[54] PIEZOELECTRIC MICROWAVE RESONATOR USING LATERAL EXCITATION

[75] Inventor: Arthur Ballato, Long Branch, N.J.

[73] Assignee: The United States of America as represented by the Secretary of the Army, Washington, D.C.

[21] Appl. No.: 823,975

[22] Filed: Jan. 30, 1986

Related U.S. Application Data

[63] Continuation-in-part of Ser. No. 664,267, Oct. 24, 1984.

[51] Int. Cl.$^4$ ............................................ H01L 41/08
[52] U.S. Cl. .................................. 310/320; 310/365; 310/366; 310/369
[58] Field of Search ................. 310/320, 365, 366, 369

[56] References Cited

U.S. PATENT DOCUMENTS

| | | | |
|---|---|---|---|
| 3,165,651 | 1/1965 | Bechmann | 310/365 |
| 3,202,846 | 8/1965 | Ballato et al. | 310/365 |
| 3,363,119 | 1/1968 | Koneval et al. | 310/320 |
| 3,531,742 | 9/1970 | Saito et al. | 310/367 X |
| 3,576,453 | 4/1971 | Mason | 310/320 |
| 3,585,418 | 6/1971 | Koneval | 310/369 X |
| 3,872,411 | 3/1975 | Watanabe et al. | 310/369 X |
| 3,891,872 | 6/1975 | Nagata et al. | 310/320 |
| 3,961,210 | 6/1976 | Nagata et al. | 310/320 |
| 4,166,230 | 8/1979 | Luft | 310/365 |
| 4,384,232 | 5/1983 | Debely | 310/365 X |
| 4,388,548 | 6/1983 | Vangheluwe | 310/365 |

OTHER PUBLICATIONS

*Trans. of the IECE of Japan*, vol. E61, No. 11, Nov., 1978, pp. 915-916, "A LiTaO$_3$ Monolithic Crystal Filter by Parallel Field Excitation", T. Uno—Discloses typical trapped energy mode resonator.
*Technical Research Centre of Finland, Pub. 25*, "Influence of Tolerances on Acoustic Bulk Wave . . .", Bertil Godenhielm, 1979, 45 pp.—Discloses use of tapered electrodes for enhancement of energy trapping.

*Primary Examiner*—Mark O. Budd
*Attorney, Agent, or Firm*—Anthony T. Lane; Jeremiah G. Murray; John T. Rehberg

[57] ABSTRACT

An improvement in piezoelectric crystal resonators using lateral excitation whereby energy of vibration trapped in a region between the electrodes is provided by the inclusion of recessed electrodes adjacent a relatively raised piezoelectric region on at least one major face or surface of the crystal. The recessed electrodes oppose one another in either a horizontal or a vertical direction to generate a lateral field in the body of the crystal upon excitation. Additionally, curved edge interfaces are provided between the recessed electrodes and the piezoelectric crystal material to reduce field gradients. Tapered electrodes which have the effect of increasing the energy trapping in the gap between the electrodes are also disclosed.

40 Claims, 37 Drawing Figures

FIG.1
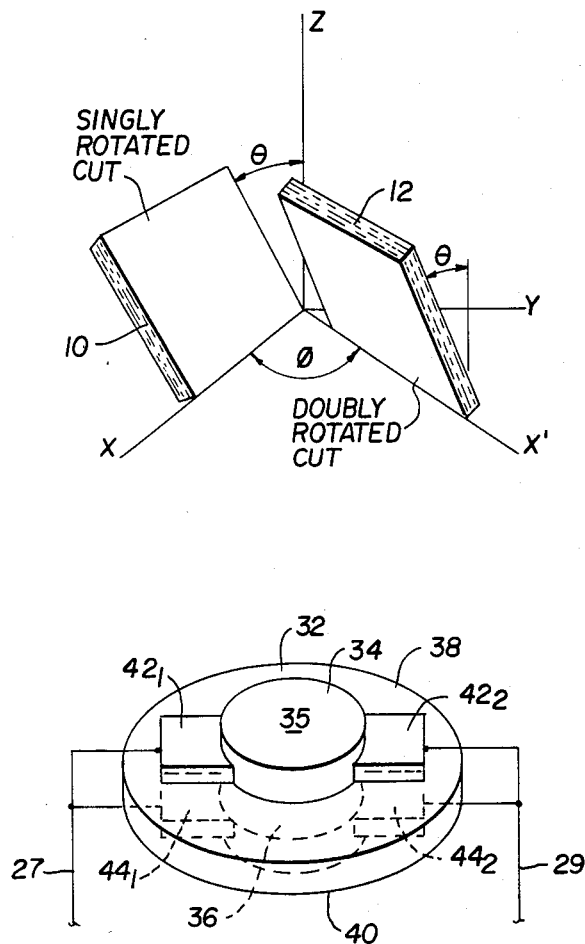
FIG.2
PRIOR ART
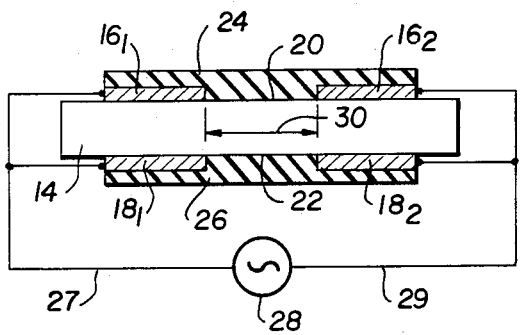
FIG.3
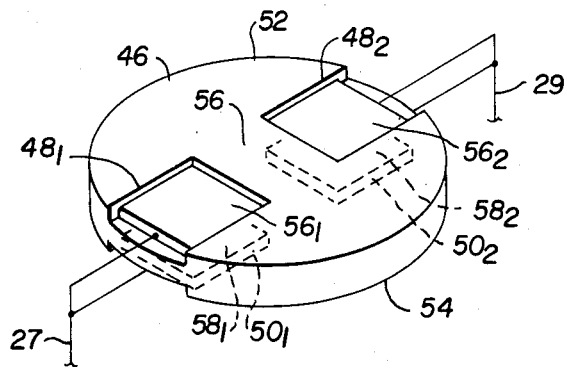
FIG.4

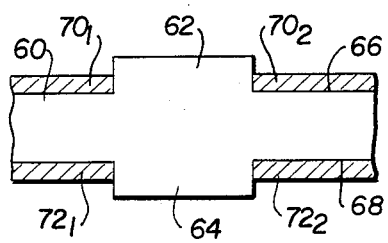
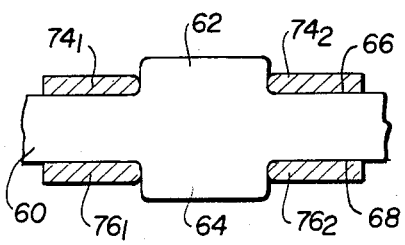
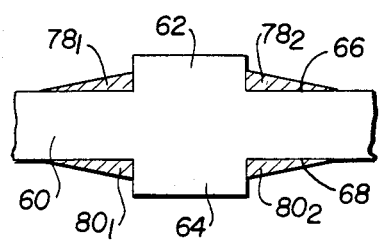
FIG.5A　　　　FIG.5B　　　　FIG.5C
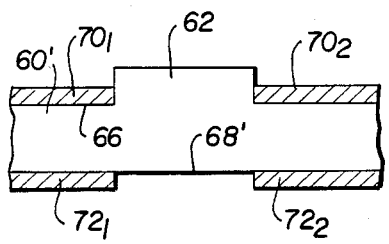
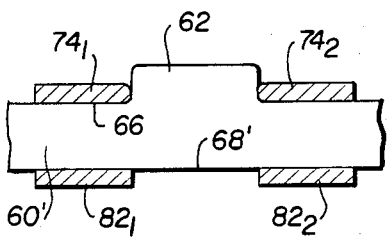
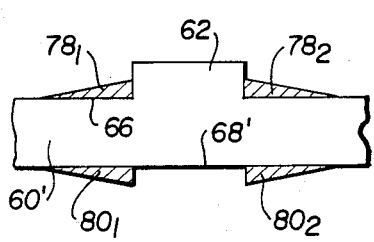
FIG.6A　　　　FIG.6B　　　　FIG.6C
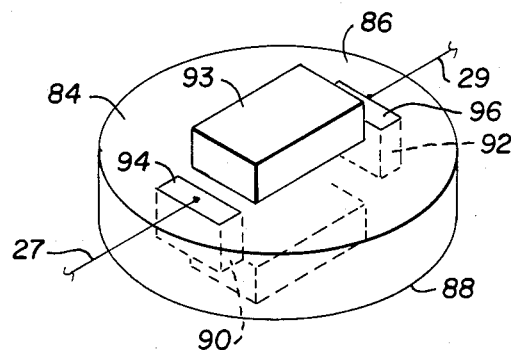
FIG.7
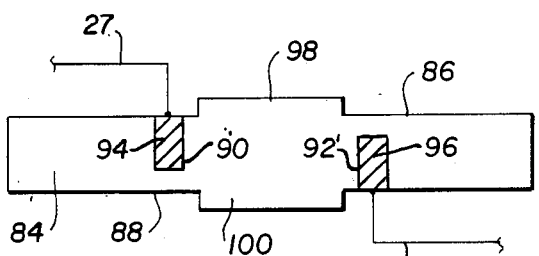
FIG.8A
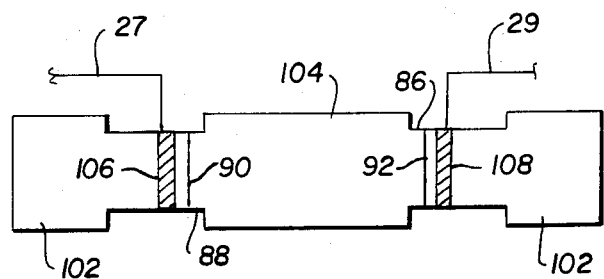
FIG.8B

PIEZOELECTRIC MICROWAVE RESONATOR USING LATERAL EXCITATION

The invention described herein may be manufactured and used by or for the government for governmental purposes without the payment of any royalties thereon or therefor.

RELATED APPLICATION

This application is a continuation in part of co-pending application Ser. No. 664,267, filed Oct. 24, 1984, entitled "Microwave Resonator Using Lateral Excitation".

Field of the Invention

This invention relates generally to the field of piezoelectric crystal resonators and more particularly to the field of acoustic bulk wave crystal resonators operating with lateral field excitation.

BACKGROUND OF THE INVENTION

The use of monolithic piezoelectric crystals as resonators is well known. As the state of the art developed, the phenomenon of energy trapping was discovered by Wilfrid S. Mortley and was published in an article entitled, "FMQ", which appeared in *Wireless World*, October, 1951, Vol. 57, pages 399–403. Still later, the behavior of thickness-shear mode quartz resonators was explained both mathematically and experimentally in terms of lateral standing wave trapped energy modes by William Shockley et al. in an article entitled, "Trapped Energy Mode In Quartz Filter Crystals", which appeared in the *Journal of The Acoustical Society of America*, April, 1967, Vol. 41, pp. 981–993. Parallel field excitation, also known as lateral excitation, was further disclosed in a publication by R. H. Bechmann entitled, "Improved High-Precision Quartz Oscillators Using Parallel Field Excitation", which appeared in the *Proceedings of the I.R.E.*, Vol. 48, March, 1960 at pp. 367–368 as well as U.S. Pat. No. 3,165,651 issued to the same R. H. Bechmann on Jan. 12, 1965. Still more recently, the construction of a trapped energy mode resonator utilizing parallel field excitation was published by Takehiko Uno in an article entitled, "A LiTaO₃ Monolithic Crystal Filter by Parallel Field Excitation", which appeared in the *Transactions of The IECE of Japan*, Vol. E61, No. 11, November, 1978, at pp. 915–916. There, two rectangular electrodes were deposited on each plate surface with a thin dielectric film deposited thereon to cover both electrode region and intermediate gap areas. With a high frequency voltage being applied to the electrodes, an elastic wave is excited and the energy of vibration is trapped in a central region of the plate by the mass loading effect of the dielectric film, thereby providing a trapped energy mode resonator which is applicable for operation in the VHF region.

Dielectric coatings, however, have been found to lead to frequency instability with the passage of time (aging), to hysteresis in the frequency-temperature characteristic, and they also contribute to the production of phase noise when the resonator is incorporated in an oscillator. These are thought to be due to the crystal/dielectric interface. The dielectric also degrades the resonator operating quality factor or "Q" because it is not, among other things, elastically matched to the crystal.

Lateral field excitation is also disclosed in a co-pending patent application entitled "Piezoelectric Rezonators Having a Lateral Field Excited SC Cut Quartz Crystal Element, Ser. No. 738,697, filed by A. Warner and assigned to the same assignee as the present invention.

It has also been found that energy trapping can be enhanced by the use of tapered electrodes. This concept was disclosed in a publication entitled, "Influence of Tolerances on Acoustic Bulk Wave Resonators Made of Thin AT-Cut Quartz Crystals", which appeared in publication 25 of the *Technical Research Center of Finland*, by Bertil Godenhielm, ESPOO, Finland, 1979. The energy trapping phenomenon may be utilized with either a plate-like (plano) piezoelectric element or with a contoured piezoelectric element. The contoured element may have a plano-convex profile or a convex-convex profile. Contoured resonators are discussed, for example, in "Resonator and Device Technology" by John Kusters in "Precision Frequency Control ed. by Eduard Gerber and Arthur Ballato, New York: Academic Press, 1985.

Accordingly, it is an object of the present invention to provide an improvement in piezoelectric crystal resonators.

It is a further object of the invention to provide an improvement in piezoelectric crystal resonators excited by lateral excitation.

It is another object of the invention to provide a reduction of frequency aging in piezoelectric resonators.

It is yet another object of the invention to reduce hysteresis in the frequency-temperature characteristic of piezoelectric resonators.

It is yet a further object of the invention to provide an improvement in the phase noise spectrum of a piezoelectric resonator using lateral excitation.

And still a further object of the invention is to provide an increase in the resonator quality factor of piezoelectric resonators using lateral excitation.

SUMMARY

Briefly, the foregoing and other objects of the invention are provided in accordance with a piezoelectric crystal resonator element preferably comprised of doubly rotated cuts of piezoelectric material including quartz, aluminum phosphate, lithium tantalate or lithium niobate which uses lateral field excitation and further includes an improved body geometry having recessed electrode regions adjacent a relatively raised piezoelectric region formed on at least one, but preferably both major faces or surfaces of a piezoelectric crystal element. The basic configuration of the piezoelectric element may be either a plate-like shape (plano) or a contoured shape with a plano-convex profile or a convex-convex profile. The convex-convex and plano-convex configurations tend to enhance the energy trapping phenomenon. Single or double mesas are formed on the element with electrode regions of lesser thickness formed thereon adjacent the respective mesa or horizontal channels of a predetermined depth formed in the element with electrodes of a lesser or equal depth being fabricated therein. Additionally, curved edges at the electrode-crystal interfaces are included to reduce field gradients as well as tapered electrodes which have the effect of increasing the energy trapping produced in the area of the crystal between the electrodes. Another embodiment of the invention includes a pair of vertical slots in the piezoelectric element with electrodes located therein.

BRIEF DESCRIPTION OF THE DRAWINGS

While the present invention is defined in the claims annexed to and forming a part of the specification, a better understanding can be had by reference to the following description when taken in conjunction with accompanying drawing in which:

FIG. 1 is a diagram illustrative of singly rotated cut and doubly rotated cut quartz crystal resonator plates oriented in relation to their crystallographic axes;

FIG. 2 is a central cross sectional view of a known piezoelectric resonator using parallel or lateral field excitation;

FIG. 3 is a perspective view generally illustrative of a first embodiment of the invention;

FIG. 4 is a perspective view generally illustrative of another embodiment of the invention;

FIG. 5A through 5C comprise cross sectional views of symmetrical modifications of the embodiments shown in FIGS. 3 and 4;

FIGS. 6A through 6C are cross sectional views illustrative of a planar surface modification of the configuration shown in FIGS. 5A through 5C;

FIG. 7 is perspective view illustrative of another embodiment of the invention; and FIGS. 8A and 8B comprise cross sectional views of modifications of the embodiment shown in FIG. 7.

Description of the Preferred Embodiments

Figure 9:
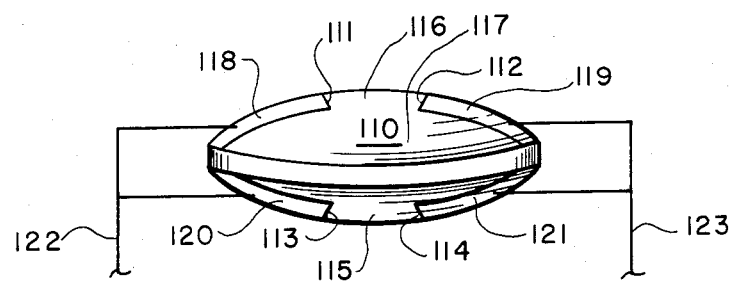
FIG. 9 is a perspective view generally illustrative of another embodiment of the invention.

Referring now to the drawings and more particularly to FIG. 1, shown thereat is a set of mutually perpendicular X, Y and Z axes which, as well known, define the crystallographic axes of piezoelectric crystal resonators according to a right-handed rectangular cartesian coordinate system. For quartz, the X axis represents the electrical axis, the Y axis represents the mechanical axis, and the Z axis represents the optical axis. In FIG. 1, two relatively thin resonator blanks or plates 10 and 12 are shown for the purpose of illustrating the distinction between well known singly and doubly rotated cuts. The singly rotated cut resonator plate 10 has its major faces oriented at a polar angle $\theta$ with respect to the Z (optical) axis, while the doubly rotated cut plate 12 includes not only the angle $\theta$, but also a second angle $\phi$ which is an angle in relation to the X (electrical) axis. Accordingly, a doubly rotated cut resonator comprises a plate having crystallographic orientations which are a function of the two angles $\theta$ and $\phi$. In the present invention, while a singly rotated cut piezoelectric plate can be utilized, a doubly rotated cut is preferably used due to the fact that, for certain crystals, such as quartz, combinations of $\theta$ and $\phi$ angles exist where static frequency-temperature characteristics are optimized, and/or thermal transient and electrode stress effects are minimized. The SC cut of quartz is a typical example.

Insofar as the piezoelectric material utilized by resonators in accordance with the subject invention, the materials preferably include quartz, lithium tantalate ($LiTaO_3$), lithium niobate ($LiNbO_3$) and aluminum phosphate ($AlPO_4$) which comprise four well known materials from which doubly rotated cuts, in particular, are formed. This group of materials, however is not meant to be considered in a limiting sense, since other types of piezoelectric materials may win favor as the state of the art progresses.

Referring now to FIG. 2, shown thereat is a laterally excited trapped energy mode resonator in accordance with the known prior art, and having been disclosed, for example, by T. Uno in the above mentioned article entitled, "A $LiTaO_3$ Monolithic Crystal Filter By Parallel Field Excitation". Such a device is comprised of a piezoelectric plate 14 having pairs of rectangular electrodes $16_1$, $16_2$ and $18_1$, $18_2$ deposited or otherwise fabricated on top of the upper and lower major faces or surfaces 20 and 22. The separation between electrodes $16_1$ and $16_2$ defines a gap region on the upper surface 20 while the electrodes $18_1$ and $18_2$ define a corresponding similar region on the lower surface 22. An uppper and lower coating 24 and 26 of dielectric material covers both the electrodes and the gap regions on both surfaces 20 and 22 of the plate 14 and it is relatively thick compared to the thickness of electrodes. Further, as shown in FIG. 2, an electrical signal generator 28 has one side commonly coupled to the electrodes $16_1$ and $18_1$ by a circuit lead 27 while the opposite side is coupled to electrodes $16_2$ and $18_2$ by means of circuit lead 29. Upon the application of a high frequency signal to the electrodes 181 . . . 182 an elastic wave is excited and the energy of vibration is trapped in the central region of the plate 14 as shown by reference numeral 30 by mass loading effect of the dielectric coatings 24 and 26 thus providing a trapped energy mode resonator.

In order to eliminate tbe shortcomings and limitations of the prior art, and particularly that of the type of device shown in FIG. 2, the present invention deletes the requirement for the dielectric coating by the embodiments now to be considered. The first embodiment of the invention shown in FIG. 3 comprises a structure which incudes a plate-like (plano-plano) body 32 having a pair of substantially identical mesas 34 and 36 respectively formed on the top and bottom major faces or surfaces of a resonator blank. The mesas 34 and 36 comprise raised inner regions of the structure which may be manufactured easily and relatively cheaply, for example, by using the etching technique shown and described in U.S. Pat. No. 4,389,275, issued to Arthur Ballato on June 21, 1983. With the mesas formed and having a predetermined thickness or height, the first pair of electrodes $42_1$ and $42_2$ having a thickness or height less than that of the mesa 34 is formed on the peripheral upper surface 38 followed by an identical pair of electrodes $44_1$ and $44_2$ formed on the same part of the lower surface 40. What is formed thereby is a thickened intermediate piezoelectric gap region 35 corresponding to the diameter of the mesas 34 and 36. Since the height of the electrodes $42_1$, $42_2$, $44_1$, $44_2$ has a height less than that of the mesas, recessed electrode regions with respect to the top surface of the mesas 34 and 36, are thus formed. Accordingly, when the upper and lower electrodes $42_1$, $42_2$ and $44_1$, $44_2$ are coupled across a high frequency signal via signal leads 27 and 29 in a manner such as shown in FIG. 2, energy will be trapped in the region 35 of the plate 32 defined by the diameter of the mesa 34 and 36.

Conversely, instead of fabricating mesa regions on a flat resonator plate, a trapped energy region defined by a thickened gap region between recessed electrode regions, can be formed as shown in FIG. 4. Referring now to FIG. 4, a piezoelectric crystal plate 46 has pairs of horizontal channels $48_1$, $48_2$ and $50_1$, $50_2$ formed in the surface of the two major faces 52 and 54. The channels can be formed in any desired manner, one example of which has been previously mentioned regarding the aforementioned U.S. Pat. No. 4,389,275. The two pairs of channels $48_1$, $48_2$ and $50_1$, $50_2$ define a thickened intermediate piezoelectric gap region 56 in the body of the crystal plate 46. Within each of the channels $48_1$, $48_2$ and $50_1$, $50_2$ there is formed respective electrodes $56_1$ $56_2$ and $58_1$, $58_2$. Further as shown in FIG. 4, the thickness of the electrodes formed in the channels is less than the channel depth and thus the electrodes are recessed below the planar outer surfaces 52 and 54 of the crystal body 46. The application of the high frequency signal across the electrodes by means of the leads 27 and 29 causes an elastic wave to be excited with the energy of vibration being trapped in the gap region 56 intermediate the electrodes $56_1$, $56_2$ and $58_1$, $58_2$.

Another embodiment of the present invention is disclosed in FIG. 9. A convex-convex shaped piezoelectric crystal element 110 has two pairs of channels 111, 112, 113 and 114 formed in the surface of two major convex faces, 115 and 116. As mentioned before, the channels can be formed in a variety of manners, the aforementioned U.S. Pat. No. 4,389,275 being particularly appropriate. The two pairs of channels 111, 112 and 113, 114 together with the intrinsic curvature of the convex faces 115 and 116 define a thickened intermediate piezoelectric gap region 117 in the body of the crystal element 110. Within each of the channels 111, 112 and 113, 114 there is formed respective electrodes 118, 119 120 and 121. The thickness of the electrodes formed in the channels may be equal to or less than the channel depth. In the embodiment of FIG. 9, the thickness of each of the electrodes is equal to the respective channel depth. The application of a high frequency signal across the electrodes by means of leads 112 and 123 causes an elastic wave to be excited with the energy of vibration being trapped in the gap region 117 intermediate the electrodes 118, 119, 120 and 121.

Figure 10:
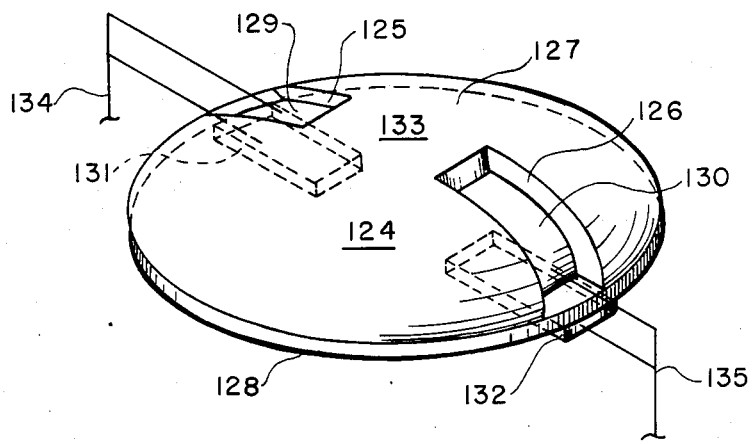
FIG. 10 is a perspective view generally illustrative of another embodiment of the invention.

As will be further elaborated below, the inventive concept may also be applied to a plano-convex shaped piezoelectric crystal. FIG. 10 illustrates a plano-convex shaped piezoelectric crystal element 124. A pair of channels 125 and 126 is formed in the convex face 127. In the particular embodiment illustrated in FIG. 10 there are no channels formed on the planar surface 128 of the element 124. However, it is possible to form channels on surface 128 in a manner akin to that illustrated in FIG. 4, if desired. As already mentioned, the channels can be formed in a variety of manners, the aforementioned U.S. Pat. No. 4,389,275 being appropriate. Within each of the channels 125 and 126 there is formed a respective electrode, 129 and 130. In the embodiment of FIG. 10, the thickness of the electrodes 129 and 130 is less than the depth of the respective channel 125 and 126. On the planar surface 128, there are two electrodes 131 and 132 positioned below and opposite electrodes 129 and 130. The electrodes 131 and 132 are deposited directly upon the planar surface 128, although, as already mentioned, they may be deposited in channels as illustrated in FIG. 4. The channels 125 and 126, together with the intrinsic curvature of the convex face 127 defines a thickened intermediate piezoelectric gap region 133 in the body of the crystal element 124. The application of a high frequency signal across the electrodes by means of leads 134 and 135 causes an elastic wave to be excited with the energy of vibration being trapped in the gap region 133.

While FIGS. 3, 4, 9 and 10 disclose four embodiments of the invention, FIGS. 5A through 6C and FIGS. 11A through 12L disclose partial cross sectional views of several different modifications of resonators in accordance with the subject invention and which, when desirable, can be employed in embodiments similar to those shown in FIGS. 3, 4, 9 and 10. Referring now to FIGS. 5A, 5B and 5C, what is intended to be shown there is a symmetrical resonator construction wherein each of the piezoelectric resonator plate elements 60 have substantially identical raised central regions 62 and 64 on both the upper and lower surfaces 66 and 68. However, what is also intended to be shown in FIG. 5A is inclusion of indefinitely extending electrodes $70_1$, $70_2$ formed on the top surface 66 and electrodes $72_1$, $72_2$ formed on the lower surface 68. With respect to the configuration shown in FIG. 5B, what is intended to be shown there is inclusion of finite length electrodes $74_1$, $74_2$ formed on the upper surface 66 and finite length electrodes $76_1$, $76_2$ formed on the lower surface 68. Additionally, however, the electrodes themselves as well as the corners of the raised piezoelectric regions 62 and 64 are rounded so that a smooth transition interface is provided between electrode material and the piezoelectric material. This has the effect of reducing field gradients. With respect to FIG. 5C, shown thereat is a piezoelectric resonator in accordance with the subject invention which includes tapered electrodes $78_1$, $78_2$ formed on the upper surface 66 and the electrodes $80_1$, $80_2$ formed on the lower surface 68. Such a configuration enhances the operation of a resonator in accordance with the subject invention due to the known increased trapping effect caused thereby.

Figure 11A:
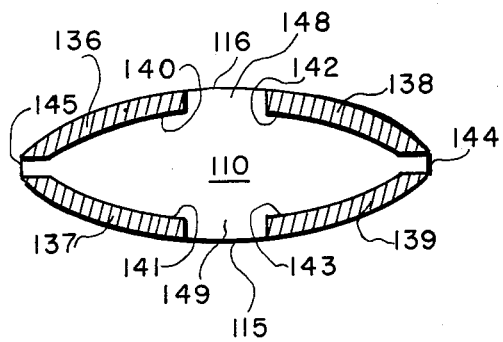
FIGS. 11A–11F are cross sectional views generally illustrative of modifications of the embodiment shown in FIG. 9.

Referring now to FIGS. 11A-11F, what is illustrated therein is a convex-convex piezoelectric resonator with various electrode configurations. Each of the piezoelectric resonator elements in FIGS. 11A-11F is designated by reference numeral 110, and each element has substantially identical upper and lower convex surfaces 116 and 115 respectively. In FIG. 11A, there are depicted four electrodes 136, 137, 138, and 139. The electrodes are deposited in grooves 140, 141, 142, and 143 respectively. The height of each electrode is equal to the depth of the respective groove. The electrodes extend along the top and bottom surfaces 116 and 115 of the resonator 110 to the edges 145 and 144. If desired, the electrode material may be deposited over the edges, thus continuously connecting electrodes 136 and 137 across edge 145 and connecting electrodes 138 and 139 across edge 144. If the electrodes are not connected by deposition of material over the edges, of course, they may be connected by leads in a manner analogous to the shown in FIG. 9, to achieve lateral excitation. The energy trapping phenomenon is observable, under lateral excitation, in the central raised areas 148 and 149 of the resonator 110.

Figure 11B:
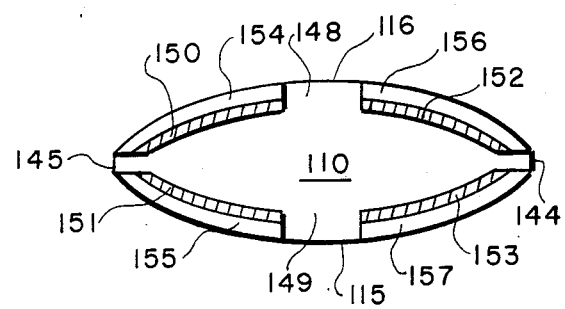

In FIG. 11B there is depicted a convex-convex piezoelectric resonator with electrodes 150, 151, 152, and 153 deposited in grooves 154, 155, 156, and 157 respectively. However, in FIG. 11B, the heights of the electrodes are less than the depths of the respective grooves.

Figure 11C:
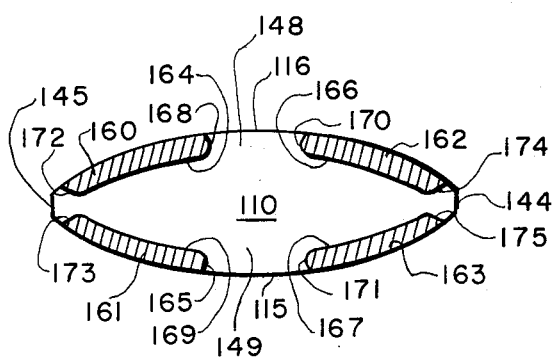

In FIG. 11C, there is depicted a convex-convex piezoelectric resonator with electrodes 160, 161, 162 and 163 deposited in grooves 164, 165, 166, and 167 respectively. In FIG. 11C the heights of the electrodes are the same as the depths of the respective grooves. However, each of the electrodes is rounded at the edges (and obviously, the respective grooves are rounded in a complementary manner to accomodate the electrodes). As shown in FIG. 5B and previously discussed the rounded edges 168, 169, 170 and 171 adjacent the central areas 148 and 149 provide a smooth transition between electrode material and piezoelectric material, thus reducing field gradients and enhancing energy trapping. In the particular embodiment of FIG. 11C, the electrodes 160, and 161 do not extend completely to the edge 145, and similarly, the electrodes 161 and 163 do not extend completely to the edge 144. Furthermore, all of the electrodes display rounded edges 172, 173, 174, and 175 on the electrode portions near the edges 145 and 144 of the crystal 110. Modification of the embodiment illustrated in FIG. 11C to incorporate electrodes which extend completely to the crystal edges or incorporate electrodes which have straight edges (similar to those shown in FIG. 11A) near the edges of the crystal is acceptable.

Figure 11D:
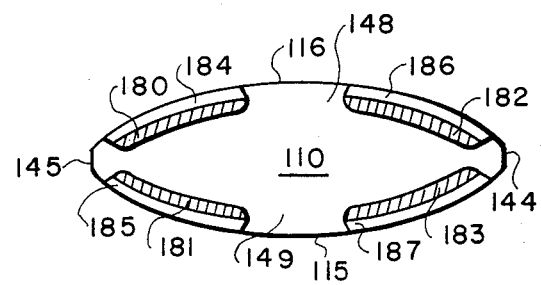

In FIG. 11D there is illustrated a convex-convex piezoelectric resonator 110 with electrodes 180, 181, 182, and 183 deposited in grooves 184, 185, 186, and 187 repectively. The heights of the electrodes are less than the depths of the respective grooves. Furthermore, the edges of the electrodes are rounded, (and, obviously, the respective grooves are rounded in a complementary manner to accommodate the electrodes).

Figure 11E:
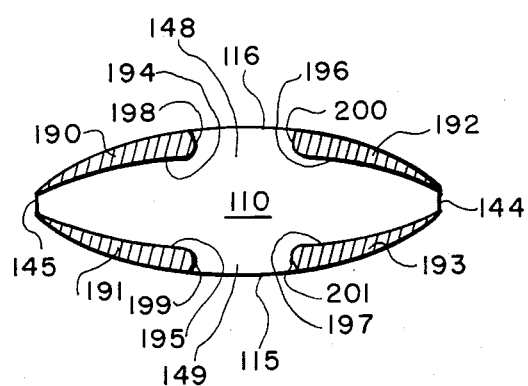

In FIG. 11E there is depicted a convex-convex piezoelectric resonator 110 with electrodes 190, 191 192 and 193 deposited in grooves 194, 195, 196, and 197 respectively. The heights of the electrodes are equal to the heights of the respective grooves. However the edges 198, 199, 201 and 201 of the electrodes adjacent the central areas 148 and 149 are rounded and the electrodes are tapered toward the edges 144 and 145 of the crystal. The tapering enhances energy trapping.

Figure 11F:
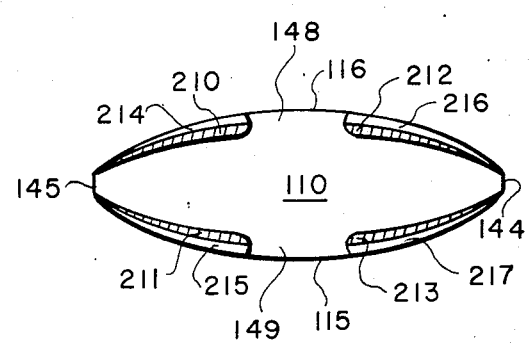

In FIG. 11F, there is shown a convex-convex piezoelectric resonator 110 with electrodes 210, 211 212 and 213 deposited in grooves 214, 215, 216 and 217 respectively. The heights of the electrodes are less than the depths of the respective grooves. The electrodes have rounded edges adjacent the central areas and are tapered toward the edges 144 and 145 of the crystal, similar to the illustration of FIG. 11E.

The configurations of FIGS. 6A, 6B and 6C are intended to disclose a configuration which, while being unsymmetrical, is nevertheless easier to manufacture and includes a resonator element 60' having a common planar lower surface 68' while retaining the raised piezoelectric regions 62 in the upper surface 66. The structure of 6A is similar to that of 5A in that it also is intended to disclose the utilization of electrodes $70_1$, $70_2$ and $72_1$, $72_2$ of indeterminate length. The configuration of FIG. 6B is similar to that of FIG. 5B with the exception that the lower electrodes $82_1$, $82_2$ do not include electrodes with rounded corners; however, when desirable, they may be rounded as shown with respect to the electrodes $76_1$ and $76_2$. Insofar as the resonator configuration in FIG. 6C is concerned, it is in all other respects with the exception of the planar surface $68_1$, identical to that of FIG. 5C. When desirable, the lower electrodes $80_1$ and $80_2$ of FIG. 6C may include curved edges for reducing any field gradients.

Figure 12A:
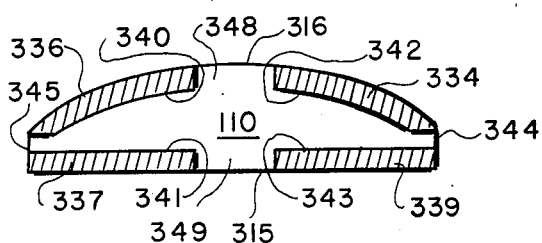
FIGS. 12A–12L are cross sectional views generally illustrative of modifications of the embodiment of FIG. 10.

Referring now to FIGS. 12A–12L, what is illustrated therein is a plano-convex piezoelectric resonator with various electrode configurations. Each of the piezoelectric resonator elements in FIGS. 12A–12L is designated by reference numeral 110, and each elements has substantially identical upper convex and lower plano surfaces 316 and 315 respectively. In FIG. 12A, there are illustrated four electrodes, 336, 337, 338, and 339. The electrodes are deposited in grooves 340, 341, 342, and 343 respectively. The height of each electrode is equal to the depth of the respective groove. The electrodes extend along the top and bottom surfaces 316 and 315 of the resonator 110 to the edges 345 and 344. If desired, the electrode material may be deposited over the edges, thus continuously connecting the electrode 336 and 337 across edge 345 and connecting electrodes 338 and 339 across edge 344. If the electrodes are not connected by deposition of material over the edges, of course, they may be connected by leads in a manner analogous to that shown in FIG. 9, to achieve lateral excitation. The energy trapping phenomenon is observable under lateral excitation in the central raised areas 348 and 349 of the resonator 110.

Figure 12B:
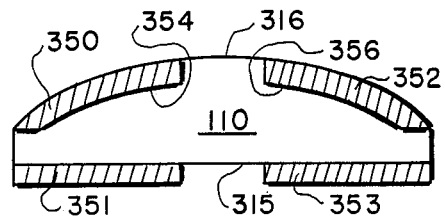

In FIG. 12B there is depicted a plano-convex piezoelectric resonator with electrodes 350, 351, 352, and 353. Electrodes 350 and 352 are deposited in grooves 345 and 356 respectively. However, (in distinction to FIG. 12A) electrodes 351 and 353 are deposited upon the bottom plano surface 315 of the resonator 110. There are no grooves cut in the bottom surface of the resonator.

Figure 12C:
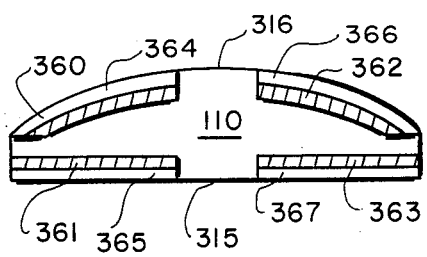

In FIG. 12C, there is depicted a plano-convex piezoelectric resonator 110 with electrodes 360, 361, 362, and 363 deposited in grooves 364, 365, 366, and 367 respectively. However, in FIG. 12C the height of the electrodes is less than the depth of the respective grooves.

Figure 12D:
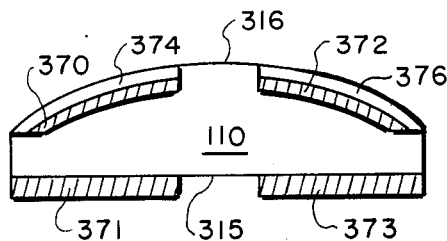

In FIG. 12D there is depicted a plano-convex piezoelectric resonator 110 with electrodes 370, 371, 372, and 373. Electrodes 370 and 372 are deposited in grooves 374 and 376 respectively. Electrodes 371 and 373 are deposited upon the flat bottom surface 315. The heights of the electrodes 317 and 372 are less than the depths of the corresponding grooves. FIG. 12D maybe considered a hybrid of FIGS. 12B and 12C.

Figure 12E:
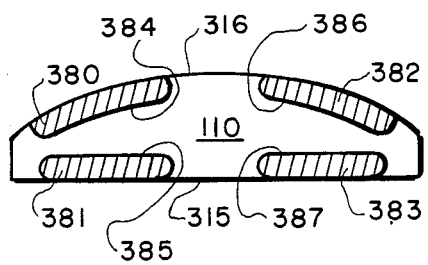
Figure 12F:
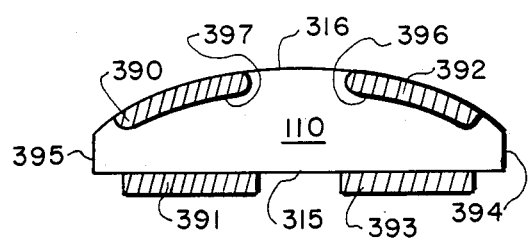
Figure 12G:
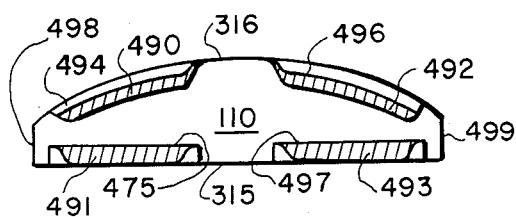

In FIG. 12E, there is depicted a plano-convex piezoelectric resonator with electrodes 380, 381, 382, and 383. The electrodes are deposited in grooves 384, 385, 386, and 387 respectively. The height of each electrode matches the depth of the corresponding groove. However, the electrodes as well as the corresponding grooves are rounded so that a smooth transition interface provided between electrode material and piezoelectric material. As indicated before, field gradients are reduced by this technique. The electrodes in the embodiment of FIG. 12E do not extend completely to the edges 385 and 384 on the piezoelectric element 110, although such extention is permissible. Still another embodiment of the present invention is illustrated in FIG. 12F. FIG. 12F features a plano-convex piezoelectric resonator 110 with electrodes 390, 391, 392, and 393. Electrodes 390 and 392 are deposited in grooves 397 and 396 respectively. Electrodes 391 and 393 are deposited upon tbe flat surface 315. There are no grooves on surface 315. Electrodes 390 and 392 are rounded to smooth the interface between electrode material and piezoelectric material, thus reducing field gradients and enhancing energy trapping. In the particular embodiment illustrated in FIG. 12F, the electrodes 390 and 391 do not extend all the way to the edge of 395 for the crystal, and electrodes 392 and 393 do extend all the way to the edge 394 of the crystal. In FIG. 12G, there is depicted a plano-convex piezoelectric resonator with electrodes 490, 491, 492, and 493 deposited in grooves 494, 495, 496, and 497 respectively. In FIG. 12G, the heights of the upper electrodes, 490, and 492, are less than the depths of the respective grooves 494 and 496. The heights of the lower electrodes, 491 and 493 are the same as the depths of the corresponding grooves, 495, and 497, although the electrodes may be recessed, if desired. Each of the four electrodes is rounded at the edges (and obviously, the respective grooves are rounded in a complementary manner to accommodate the electrodes). The electrodes, 490, 491, 492 and 493 do not extend completely to the edges 495 and 494.

Figure 12H:
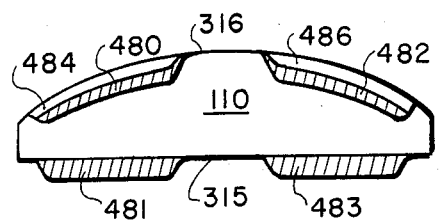

In FIG. 12H, there is depicted a plano-convex piezoelectric resonator 110 with electrodes 480, 481, 482, and 483. The upper electrodes, 480, and 482 are deposited in respective grooves, 484, and 486. The lower electrodes, 481, and 483 are deposited upon the flat surface 315 of the resonator 110. The heights of the electrodes 480 and 482 are less than the depths of the respective grooves 484 and 486. All the electrodes are rounded.

Figure 12I:
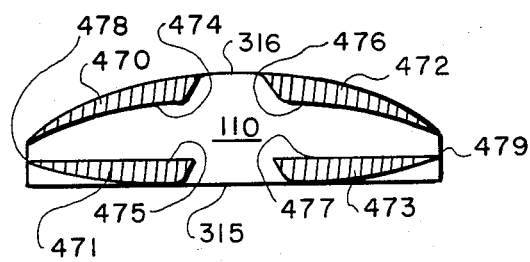

In FIG. 12I there is a depicted a plano-convex piezoelectric resonator with electrodes 470, 471, 472 and 473. The electrodes are deposited in corresponding grooves, 474, 475, 476, and 477. The heights of the electrodes are the same as the depths of the respective grooves. Each of the electrodes, as well as the corners of the respective groove, are rounded adjacent to the energy trapping region 500 to provide the aforementioned smooth transition between the electrode material and piezoelectric material. Furthermore, each of the electrodes is smoothly tapered as it extends toward the edges 478 and 479 of the crystal.

Figure 12J:
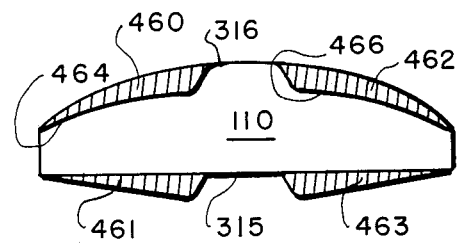

In FIG. 12J there is depicted a plano-convex piezoelectric resonator 110 with electrodes 460, 461, 462, and 463. Upper electrodes 460 and 462 are deposited in respective grooves 464 and 466. Lower electrodes 461 and 463 are deposited upon a flat surface 315 of the crystal 110. All of the electrodes are rounded and tapered as previously discussed. The heights of electrodes 460 and 462 are equal to the depths of the corresponding grooves 464 and 466.

Figure 12K:
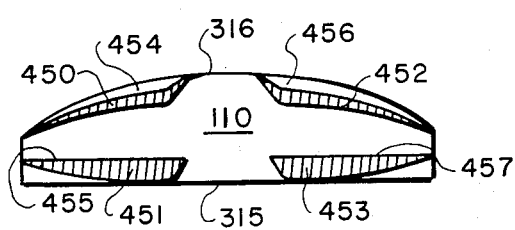

In FIG. 12K there is depicted a plano-convex piezoelectric resonator with electrodes 450, 451, 452, and 453. Each of the electrodes is deposited in respective grooves, 454, 455, 456, and 457. The heights of the upper electrodes, 450 and 452, are less than the depths of the respective grooves 454 and 456. The heights of the lower electrodes 451 and 453 are equal at their maximum point to the greatest depth of the corresponding grooves 455 and 457, although the electrodes may be recessed even further if desired. All of the electrodes are rounded and tapered as discussed previously.

Figure 12L:
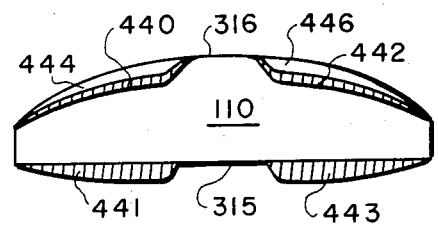

Finally, FIG. 12L depicts a plano-convex piezoelectric resonator 110 with electrodes 440, 441, 442, and 443. Upper electrodes 440 and 442 are deposited in respective grooves 444, and 446. Lower electrodes 441 and 443 are deposited upon the flat surface 315 of the crystal 110. The upper electrodes 440 and 442 are recessed, and all of the electrodes are rounded and tapered.

It should be pointed out that the electrodes applied to the surface of the resonator plates in the various configurations described above typically comprise metallization in the form of aluminum electrodes and as such these electrodes can be impedance-matched to the piezoelectric substrates and can achieve a match to within 4% for the slow shear mode for quartz. Additionally, where the resonator is utilized as a filter, circuit coupling can be controlled by adjusting, i.e., trimming the gap between electrodes insofar as the width and depth or height of the gap is concerned and may be done by chemical or laser etching as described above and thus the fundamental operating frequency $f_o$ can be suitably adjusted.

Still another embodiment of the invention is shown in FIG. 7 and comprises an embodiment wherein the electrodes are disposed vertically, i.e., transversely, relative to the major faces of the resonator plate as opposed to the horizontal placement of electrodes such as shown in FIGS. 3 and 4. With regard to the embodiment of FIG. 7, disclosed thereat is a piezoelectric crystal plate 84 including upper and lower flat surfaces 86 and 88 in accordance with conventional practice. In the upper surface 86, however, there is formed two mutually parallel slots 90 and 92 which extend into the body of the resonator plate a predetermined depth between a mesa region 93. The slots 90 and 92 are back-filled or deposited with metallization 94 and 96 to which is connected electrical leads 27 and 29 for the application of energizing potential from the high frequency generator, not shown. The region 93 separating the metallized slots 90 and 92 provides a gap region which when excited thereby provides a trapped energy mode resonator due to the lateral fields generated in the body of the crystal 84.

Two variations of this type of resonator are further shown in FIGS. 8A and 8B. With respect to the structure of the resonator in 8A, it is similar to the embodiment shown in FIG. 7 with the exception that one of the vertical slots is fabricated in the lower surface 88 of the plate 84 as opposed to having both slots provided in the upper surface 84. Additionally, two mesa regions 98 and 100 are formed on the surfaces 86 and 88. Accordingly, a vertically disposed slot 92' is formed in the lower surface 88 of the resonator plate 84 with metallization. 96 disposed therein. The depths of the slots 90 and 92' are such that they mutually overlap and upon application of the excitation voltage to the leads 27 and 29, a substantially horizontal lateral field is generated between the metallizations 94 and 96.

With respect to the structural configuration of FIG. 8B, what is shown there is a ring-supported circular piezoelectric resonator plate having enlarged peripheral and central regions 102 and 104, with the former being adapted to engage ring supports, not shown. A ring-supported resonator is well known in the art and is disclosed for purposes of illustrating other shapes of resonator plates which may be used for practicing the invention. What is significant, however, is the inclusion of slots 90 and 92 adjacent to the enlarged central region 104 which extend through the entire thickness of the intermediate body portion of the resonator. Instead of back filling the slots 90 and 92 entirely with metallization, the embodiment of 8B contemplates the inclusion of discrete electrodes 106 and 108 formed on the outer surface of the vertical slots 90 and 92 with electric leads 27 and 29 connected thereto for the application of an energizing signal. Such an arrangement provides for a reduction in electrode stress during operation and subsequent aging.

Figure 13A:
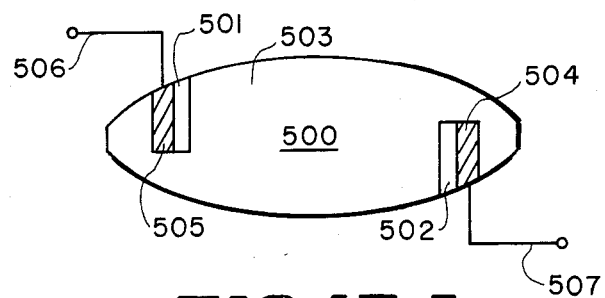
FIGS. 13A–13D are cross-sectional views generally illustrative of another embodiment of the invention.
Figure 13B:
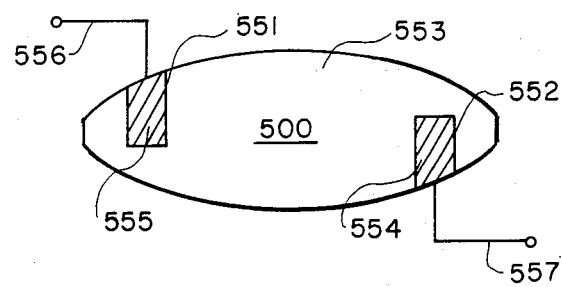

Additional slotted electrode embodiments for convex-convex and plano-convex resonators are illustrated in FIGS. 13A–13D. FIGS. 13A and 13B depict a convex-convex resonator 500. In FIG. 13A, slots 501 and 502 are positioned adjacent an enlarged central region 503. Discrete electrode 504 and 505 are formed on the outer surfaces of the slots 501 and 502 with the electric leads 506 and 507 connected thereto for the application of an energizing signal. As mentioned before, the embodiment of FIG. 13A provides for a reduction in the electrode stress during operation and subsequent aging. FIG. 13B illustrates a convex-convex resonator 500 with slots 551 and 552 adjacent the enlarged central region 553. Slot 551 is formed in the upper surface of the resonator 500, and slot 552 is formed in the lower surface of the resonator. Metallized electrodes 555 and 554 are deposited in the upper and lower slots, respectively. The electrode material completely fills each slot. Leads 556 and 557 are connected to an energizing signal. In both FIGS. 13A and 13B, the depths of the respective slots are such that they mutually overlap, and upon application of the excitation voltage, a substantially horizontal lateral field is generated between the respective electrodes.

Figure 13C:
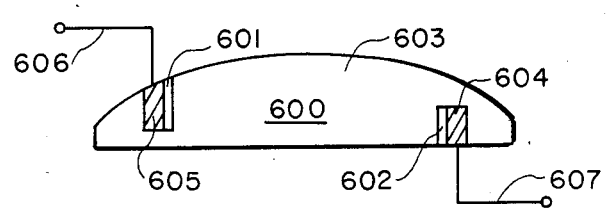
Figure 13D:
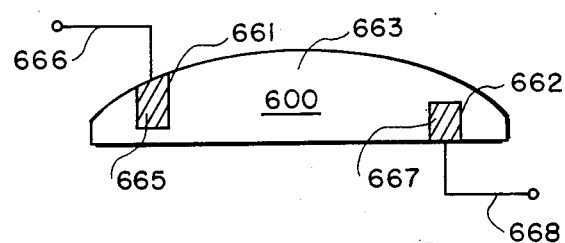

FIGS. 13C and 13D illustrate embodiments of the aforementioned concept in plano-convex resonators. In FIG. 13C, a plano-convex resonator 600 is disclosed. Slots 601 and 602 are positioned adjacent the enlarged central region 603. The slots are only partially filled with metallization. Discrete electrodes 605 and 604 are formed on the outer surface of slots 601 and 602, respectively. Electric leads 606 and 607 are connected to respective electrodes for the application of an energizing signal. Similarly, in FIG. 13D plano-convex resonator 600 has slots 661 and 662 vertically disposed adjacent a thickened central region 663. Electrodes 665 and 667 completely filled slots. Leads 666 and 668 are connected to the respective electrodes to provide lateral field excitation.

Thus what has been shown and described is an improvement in piezoelectric resonators using lateral excitation wherein recessed electrodes, both horizontal and vertical, are provided with the resulting enhancement of the piezoelectric coupling factor k. Such devices are particularly adapted for utilization with spread spectrum and fast-frequency hopping communications systems.

Having thus shown and described what is at present considered to be the preferred embodiments of the invention, it should be pointed out that the same has been made by way of illustration and not limitation. Accordingly, all further alterations, modifications and changes coming within the spirit and scope of the present invention as defined in the appended claims are herein meant to be included.

What is claimed is:

1. A piezoelectric resonator activated by a lateral excitation, comprising:
a body of piezoelectric material including a pair of opposing major faces; and
means for providing lateral excitation of said body of piezoelectric material, said means including a pair of spaced recesses on opposite sides of a central open area of said body, a pair of electrodes located in said recesses on said opposite sides, a surface of said area between said electrodes being raised above the uppermost level of said electrodes, and signal generator means connected to said electrodes on said opposite sides to apply said lateral excitation, said central area providing a piezoelectric gap region for energy trapping in said central area of said body.

2. The resonator as defined by claim 1 wherein said lateral excitation means includes first and second pairs of recesses and electrodes respectively located on both of said pair of major faces.

3. The resonator as defined by claim 2 wherein said central area of said body is a mesa region.

4. The resonator as defined by claim 3 wherein said second pair of electrodes is separated on the other of said faces by a second mesa region of piezoelectric material of said body having an outer surface which lies in a plane above the surface of said second pair of electrodes.

5. The resonator as defined by claim 3 wherein said pairs of electrodes have a predetermined length on the surfaces of said pair of major faces.

6. The resonator as defined by claim 3 wherein the interface between said electrodes and said body of piezoelectric material includes rounded corners for reducing field gradients therebetween.

7. The resonator as defined by claim 3 wherein said electrode means includes tapered electrodes whose thickness decreases in an outward direction from the center of said body of piezoelectric material for enhancing energy trapping in said gap region.

8. The resonator as defined by claim 3 where said second pair of electrodes is located in like respective recesses formed on the other of said pair of major faces, the second pair of recesses being in registration with the first pair of recesses and having the same mutual separation therebetween for further defining said gap region.

9. The resonator as defined by claim 5 wherein said electrodes have substantially the same predetermined length.

10. The resonator as defined by claim 1 wherein said central area has a raised surface on one of said opposing faces of said body and wherein said recesses include first and second vertical slots formed in said at least one face of said pair of major faces outwardly of and adjacent said central raised area and including electrodes deposited therein and wherein said central area between the slots containing said electrodes defines said gap region wherein energy of vibration is trapped upon resonator excitation.

11. The resonator as defined by claim 1 wherein said central area has raised surfaces on both of said opposing faces of said body and wherein said recesses include a first vertical slot formed in one of said pair of major faces outwardly of an adjacent said central area and a second slot formed in the other of said pair of major faces outwardly of and adjacent said central area, said central area thereby defining said gap region and including electrodes deposited in said slots, whereby energy of vibration is trapped in said gap region upon resonator excitation.

12. The resonator as defined by claim 1 wherein said central area has a raised surface on both of said opposing faces of said body and said recesses include a pair of slots formed through the body of said piezoelectric material outwardly of said central area and substantially transverse to said pair of major faces, said vertical slots including a predetermined thickness layer of electrode material formed on the outer walls of said slots, said central areas thereby defining a gap region for the trapping of energy of vibrations upon resonator excitation.

13. The resonator as defined by claim 1 wherein said body has a plate-like configuration with both of said opposing major faces being substantially flat.

14. The resonator as defined by claim 1 wherein said body has a lens-like configuration with both of said opposing major faces being substantially convex.

15. The resonator as defined by claim 1 wherein said body has a plano-convex configuration with one of said opposing major faces being substantially convex and the other said face being substantially flat.

16. The resonator as defined by claim 14 wherein said lateral excitation means includes first and second pairs of recesses and electrodes respectively located on the surfaces of both of said pair of major faces.

17. The resonator as defined by claim 15 wherein said lateral excitation means includes first and second pairs of recesses and electrodes respectively located on the surfaces of both of said pair of major faces.

18. The resonator as defined by claim 15 wherein said lateral excitation means includes a first pair of recesses and electrodes located on said convex face and a second pair of electrodes located on said flat face.

19. The resonator as defined by claim 16 wherein the thickness of said electrodes is less than the depth of said recesses.

20. The resonator as defined by claim 16 wherein the interfaces between said electrodes and said body of piezoelectric material includes rounded corners for reducing field gradients therebetween.

21. The resonator as defined by claim 19 wherein the interfaces between said electrodes and said body of piezoelectric material includes rounded corners for reducing field gradients therebetween.

22. The resonator as defined by claim 16 wherein said electrode means includes tapered electrodes whose thickness decreases in an outward direction from the center of said body of piezoelectric material for enhancing energy trapping in said gap region.

23. The resonator as defined by claim 22 wherein the thickness of said electrodes is less than the depth of said recesses.

24. The resonator as defined by claim 17 wherein the thickness of said electrodes is less than the depth of said recesses.

25. The resonator as defined by claim 18 wherein the thickness of said first pair of electrodes is less than the depth of said first pair of recesses.

26. The resonator as defined by claim 17 wherein the interfaces between said electrodes and said body of piezoelectric material includes rounded corners for reducing field gradients therebetween.

27. The resonator as defined by claim 18 wherein the interfaces between said first pair of electrodes and said recesses includes rounded corners for reducing field gradients therebetween.

28. The resonator as defined by claim 26 wherein the thickness of at least one pair of electrodes is less than the depth of said recesses.

29. The resonator as defined by claim 27 wherein the thickness of said first electrodes is less than the depth of said recesses.

30. The resonator as defined by claim 17 wherein said electrode means includes tapered electrodes whose thickness decreases in an outward direction from the center of said body of piezoelectric material for enhancing enery trapping in said gap region.

31. The resonator as defined by claim 18 wherein said first pair of electrodes is tapered, their thickness decreasing in an outward direction from the center of said body of piezoelectric material for enhancing energy trapping in said gap region.

32. The resonator as defined by claim 10 wherein said body has a plano-convex configuration.

33. The resonator as defined by claim 10 wherein said body has a convex-convex configuration.

34. The resonator as defined by claim 11 wherein said body has a plano-convex configuration.

35. The resonator as defined by claim 11 wherein said body has a convex-convex configuration.

36. The resonator as defined by claim 12 wherein said body has a plano-convex configuration.

37. The resonator as defined by claim 12 wherein said body has a convex-convex configuration.

38. The resonator as defined by claim 10 wherein said body has a slotted ring configuration.

39. The resonator as defined by claim 11 wherein said body has a slotted ring configuration.

40. The resonator as defined by claim 12 wherein said body has a slotted ring configuration.

* * * * *